US007015770B2

(12) United States Patent
Takasu

(10) Patent No.: US 7,015,770 B2
(45) Date of Patent: Mar. 21, 2006

(54) HIGH FREQUENCY SWITCH

(75) Inventor: Hideki Takasu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/785,062

(22) Filed: Feb. 25, 2004

(65) Prior Publication Data

US 2004/0182686 A1 Sep. 23, 2004

(30) Foreign Application Priority Data

Mar. 19, 2003 (JP) ............................ 2003-076175

(51) Int. Cl.
*H01P 1/10* (2006.01)
*H01P 5/12* (2006.01)

(52) U.S. Cl. ...................................... 333/103; 333/101

(58) Field of Classification Search ................ 333/101, 333/103, 104, 116, 262
See application file for complete search history.

(56) References Cited

U.S. PATENT DOCUMENTS 5,170,139 A * 12/1992 Nelson ....................... 333/103
5,483,209 A * 1/1996 Takayama ................... 333/174
5,777,530 A * 7/1998 Nakatuka .................... 333/104
6,011,450 A * 1/2000 Miya ......................... 333/103
6,492,882 B1 * 12/2002 Cayrou et al. ............. 333/101

FOREIGN PATENT DOCUMENTS

JP 6-196724 7/1994

* cited by examiner

*Primary Examiner*—Dean Takaoka
(74) *Attorney, Agent, or Firm*—Oblon, Spivak, McClelland, Maier & Neustadt, P.C.

(57) ABSTRACT

A high frequency switch is provided with an input terminal, an output terminal, a first diode, a second diode, a first resistor, a third diode and a second resistor. The first diode is provided in a signal line, which connects the input terminal to the output terminal. The first diode has an input end and an output end. The second diode has one end, which is connected to the input end side of the first diode. The first resistor is provided in a terminated line, which is connected to another end of the second diode. The third diode has one end, which is connected to the output end side of the first diode. The second resistor is provided in a terminated line, which is connected to another end of the third diode.

3 Claims, 2 Drawing Sheets

15
14
BC2
BC1
16
11
C1
C2
C3
17
12
BC3
13

HIGH FREQUENCY SWITCH

BACKGROUND OF THE INVENTION

1. Field of the Invention

The present invention relates a high frequency switch, which is to be usable for a radio equipment.

2. Related Art

An example of a conventional microwave switch, which is to be used for a receiving unit of a radio equipment, for example, is illustrated in FIG. 3, and the switch shown in FIG. 3 is a single-input/single-output switch, which will hereinafter be referred to as the "SPST (Single-Pole Single-Throw) switch" utilizing diodes, in which an antenna is commonly utilized for transmitting and receiving units. That is, in the switch of FIG. 3, a diode 31 is arranged between an input terminal 34 and an output terminal 35 and another diode 32 is provided in a terminated line so as to be in parallel to the diode 3*s*, to which a terminating resistor 33 is connected.

In this arrangement of the switch in FIG. 3, in a case that the diode 32 is made OFF while keeping the diode 31 in an ON position, a high frequency signal, which has been inputted from the input terminal 34, is outputted to the output terminal 35. Such a state will be hereinlater referred to as a "passing state".

On the other hand, in a case that the diode 31 is kept in an OFF position and the other diode 32 is kept in an ON position, the high frequency signal, which has been inputted from the input terminal 34, passes through the diode 32 and then is absorbed by the terminating resistor 33. Such a state will be hereinlater referred to as an "absorbed state".

The SPST switch as shown in FIG. 3, which is now kept in the absorbed state, causes the input signal to be absorbed by the terminating resistor, thus providing an appropriate VSWR (voltage standing wave ratio) of the input terminal 34. However, the diode 31 is kept in the OFF state, with the result that the input signal is subjected to an almost total reflection to thereby deteriorate the VSWR of the output terminal 35, thus causing inconvenience and being defective.

Furthermore, there is provided Japanese Laid-Open Patent Application No. H9-181641 (hereinafter referred to as the "Prior Art Document 1"), which describes, especially on page 2 and in FIG. 1, as another example of the conventional high frequency switch, a single-input/multiple-output switch utilizing FETs (field-effect transistors). The disclosed high frequency switch utilizes an inductor for preventing, when a certain FET is kept in an ON position to generate an input signal to an output terminal, occurrence of conductive loss due to capacity of another FET in an OFF position. However, the Prior Art Document 1 fails to teach the prevention of deterioration in the VSWR of the input and output terminals.

As mentioned above, the conventional SPST switch shown in FIG. 3 can provide an appropriate VSWR on the input side with the use of the terminating resistor connected to the side of the input terminal in the absorbed state of the switch circuit. However, the almost total reflection occurs on the output side, which causes the deterioration of the VSWR.

SUMMARY OF THE INVENTION

An object of the present invention, which was made to solve the above-described problems, is therefore to provide a high frequency switch, which permits to obtain appropriate VSWRs of the input and output sides in a state in which a switch circuit is kept on an OFF position.

The above and other objects can be achieved according to the present invention by providing, in one aspect, a high frequency switch comprising: an input terminal; an output terminal; a first diode provided in a signal line, which connects the input terminal to the output terminal, the first diode having an input end and an output end; a second diode having one end, which is connected to the input end side of the first diode; a first resistor provided in a terminated line, which is connected to another end of the second diode; a third diode having one end, which is connected to the output end side of the first diode; and a second resistor provided in a terminated line, which is connected to another end of the third diode.

According to the high frequency switch of the present invention of this aspect, it is possible to ensure appropriate VSWR performance on both the input and output sides of a switch circuit, which is kept in an OFF position, by providing, on the input side of the first diode provided in the signal line, the second diode and the first resistor so as to be in parallel with the first diode, and further providing, on the output side of the first diode, the third diode and the second resistor so as to be in parallel with the first diode.

In another aspect of the present invention, there is also provided a high frequency switch comprising: a single input terminal; a plurality of output terminals; a plurality of first diodes provided in respective signal lines, which connect said input terminal to the plurality of output terminals, each of said plurality of first diodes having an input end and an output end; a second diode having one end, which is connected to input end sides of the plurality of first diodes; a first resistor provided in a terminated line, which is connected to another end of the second diode; a plurality of third diodes having ends, which are respectively connected to the outputs of the plurality of first diodes; and a plurality of second resistors provided in terminated lines, which are respectively connected to other ends of the plurality of third diodes.

According to this aspect, substantially the same functions and effects as those mentioned above with reference to the first aspect of the present invention will be attained.

Further, in the above aspects, the high frequency switch may further comprise capacitors connected to the ends of the first to third diodes in order to make ON-OFF control of the diodes and DC bias circuits connected thereto in order to apply a DC bias.

The mature and further characteristic features of the present invention will be made more clear from the following descriptions made with reference to the accompanying drawings.

DESCRIPTION OF THE PREFERRED EMBODIMENTS

Preferred embodiments of a high frequency switch of according to the present invention will be described in detail hereunder with reference to the accompanying drawings.

Figure 1:
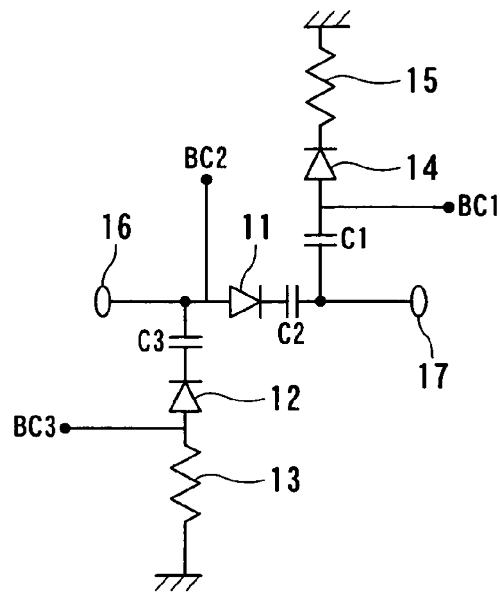
FIG. 1 is a view illustrating a configuration of a high frequency switch according to a first embodiment of the present invention.

FIG. 1 shows a configuration of one of microwave switches, i.e., a SPST (Single-Pole Single-Throw) switch, as the first embodiment of the high frequency switch according to the present invention.

In the SPST switch, a first diode 11 for carrying out a switching operation is connected to a signal line between an input terminal 16 and an output terminal 17, as shown in FIG. 1. A second diode 12 is connected, at one end thereof, to an input side of the first diode 11 to be in parallel with the first diode 11. In addition, a first resistor, i.e., a terminating resistor 13 normally having resistance of 50 Ω is connected to the other end of the second diode 12. Further, a third diode 14 is connected, at one end thereof, to an output side of the first diode 11 to be in parallel with the first diode 11. In addition, a second resistor, i.e., a terminating resistor 15 normally having resistance of 50 Ω is connected to the other end of the third diode 14.

Further, as briefly shown in FIG. 1, capacitors C1 to C3 may be connected to the ends of the first to third diodes 11, 12, 14 at their appropriate positions in order to make ON-OFF control of these diodes 11, 12, 14, and DC bias circuits BC1 to BS3 may also be connected thereto in order to apply a DC bias.

When the first diode 11 is made "ON" and the second and third diodes 12, 14 are, on the other hand, made "OFF" in the SPST switch having the above-described configuration, a frequency signal, which has been inputted from the input terminal 16, is generated to the output terminal 17.

On the contrary, when the first diode 11 is made "OFF" and the second and third diodes 12, 14 are, on the other hand, made "ON", the frequency signal, which has been inputted from the input terminal 16, passes through the second diode 12 and then is absorbed by the terminating resistor 13. In this instance, a VSWR (Voltage Standing Wave Ratio) of the input terminal 16 can provide a good performance by selecting the resistance of the terminating resistor 13 to be 50 Ω, which is substantially identical to the impedance of an external circuit of the input side. Further, with respect to the VSWR of the output terminal 17, by keeping the third diode 14 in the "ON" position and connecting the terminating resistor 15 having the resistance of 50 Ω to the third diode 14, it becomes possible to make matching with the impedance of 50 Ω of an external circuit, thus also providing an appropriate VSWR performance.

In the above-described embodiment, although the present invention is applied to the SPST switch, it is not limited only to such an embodiment and is applicable to a single-input/multiple-output switch utilizing diodes.

Figure 2:
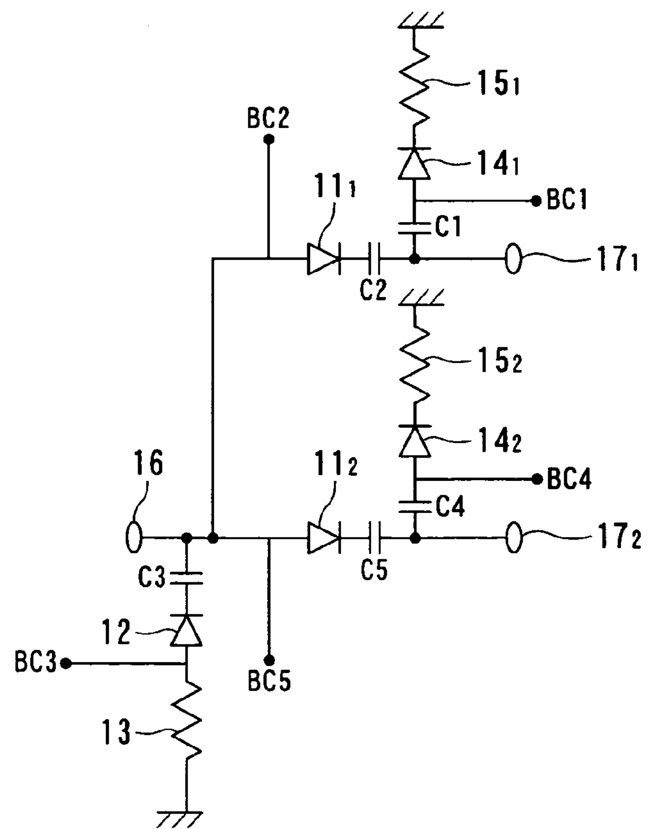
FIG. 2 is a view illustrating a configuration of a high frequency switch according to a second embodiment of the present invention.
Figure 3:
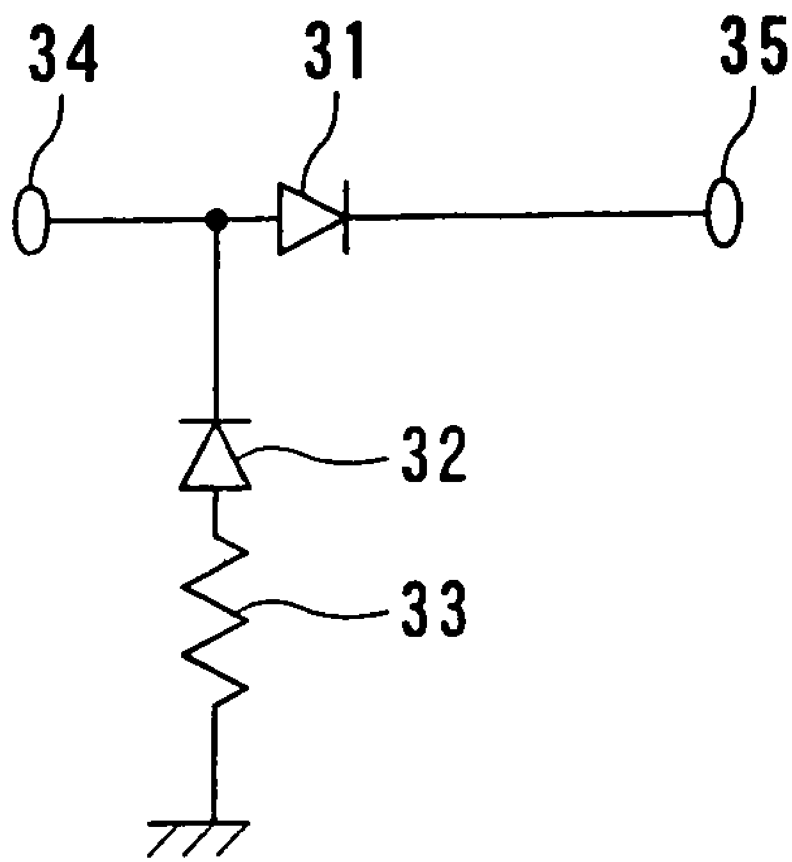
FIG. 3 is a view illustrating a configuration of a conventional high frequency switch.

That is, with reference to FIG. 2 showing a configuration of a single input-two output microwave switch of the second embodiment of the present invention, a plurality of first diodes $11_1$, $11_2$ (two, in the illustrated embodiment) for carrying out a switching operation are connected to a signal line between an input terminal 16 and a plurality of output terminals $17_1$, $17_2$ (two, in the illustrated embodiment). A second diode 12 is connected, at one end thereof, to input sides of the first diodes $11_1$, $11_2$ to be in parallel with the first diodes $11_1$, $11_2$. In addition, a first resistor, i.e., a terminating resistor 13 normally having resistance of 50 Ω is connected to the other end of the second diode 12. Further, a plurality of third diodes $14_1$, $14_2$ (two, in the illustrated embodiment) are connected at respective one ends thereof to the respective outputs of the first diodes $11_1$, $11_2$ to be in parallel with the first diodes $11_1$, $11_2$. In addition, a plurality of second resistor, i.e., terminating resistors $15_1$, $15_2$ (two, in the illustrated embodiment) normally having resistance of 50 Ω are connected to the other ends of the third diodes $14_1$, $14_2$, respectively.

Furthermore, in the single-input/two-output switch shown in FIG. 2, when at least one of the plurality of first diodes $11_1$, $11_2$ is made "ON", the second diode 12 is made "OFF", the third diode, which corresponds to the first diode now kept in the ON position, is made "OFF", and the third diode, which corresponds to the other first diode now kept in the OFF position, is made "ON". On the other hand, when all of the plurality of first diodes $11_1$, $11_2$ are kept in the OFF position, all of the second diode 12 and the plurality of third diodes $14_1$, $14_2$ are kept in the ON position. This makes it possible to provide appropriate VSWR on the both of the input and output sides of the switch circuit, which is kept in the OFF position.

Further, as also briefly shown in FIG. 2, capacitors C1 to C5 may be connected to the ends of the first to third diodes $11_1$, $11_2$, $12_1$, $12_2$, $14_1$, $14_2$ at their appropriate positions in order to make ON-OFF control of these diodes, and DC bias circuits BC1 to BS5 may also be connected thereto in order to apply a DC bias.

According to the present invention of the characters mentioned above through the preferred embodiments, it is possible to ensure appropriate VSWR on both the input and output sides of a switch circuit, which is now kept in an OFF position, by providing, on the input side of the first diode provided in the signal line, the second diode and the first resistor so as to be in parallel with the first diode, and further providing, on the output side of the first diode, the third diode and the second resistor so as to be in parallel with the first diode.

It is to be noted that the present invention is not limited to the described embodiments and many other changes and modifications made with reference to the accompanying drawings.

What is claimed is:

1. A high frequency switch comprising:

an input terminal;

an output terminal;

a first diode provided in a signal line, which connects said input terminal to said output terminal, said first diode having an input end and an output end;

a second diode having one end, which is connected to the input end side of the first diode;

a first resistor provided in a first terminated line, which is connected to another end of the second diode;

a third diode having one end, which is connected to the output end side of the first diode;

a second resistor provided in a second terminated line, which is connected to another end of the third diode; and capacitors connected to the ends of the first to third diodes in order to make ON-OFF control of the diodes and DC bias circuits connected thereto in order to apply a DC bias.

2. A high frequency switch comprising:

a single input terminal;

a plurality of output terminals;

a plurality of first diodes provided in respective signal lines, which connect said input terminal to said plurality of output terminals, each of said plurality of first diodes having an input end and an output end;

a second diode having one end, which is connected to input end sides of the plurality of first diodes;

a first resistor provided in a terminated line, which is connected to another end of the second diode;

a plurality of third diodes having ends, which are respectively connected to the outputs of the plurality of first diodes; and a plurality of second resistors provided in terminated lines, which are respectively connected to other ends of the plurality of third diodes.

3. A high frequency switch according to claim 2, further comprising capacitors connected to the ends of the first to third diodes in order to make ON-OFF control of the diodes and DC bias circuits connected thereto in order to apply a DC bias.

* * * * *